United States Patent
Jaiswal et al.

(10) Patent No.: US 11,475,941 B2
(45) Date of Patent: Oct. 18, 2022

(54) NON-VOLATILE TRANSISTOR EMBEDDED STATIC RANDOM ACCESS MEMORY (SRAM) CELL

(71) Applicant: GLOBALFOUNDRIES U.S. Inc., Santa Clara, CA (US)

(72) Inventors: Akhilesh R. Jaiswal, West Lafayette, IN (US); Bipul C. Paul, Mechanicville, NY (US); Steven R. Soss, Saratoga Springs, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/110,674

(22) Filed: Dec. 3, 2020

(65) Prior Publication Data
US 2022/0180923 A1    Jun. 9, 2022

(51) Int. Cl.
*G11C 11/412* (2006.01)
*G11C 11/419* (2006.01)
*H01L 27/11* (2006.01)

(52) U.S. Cl.
CPC .......... *G11C 11/412* (2013.01); *G11C 11/419* (2013.01); *H01L 27/1104* (2013.01)

(58) Field of Classification Search
None
See application file for complete search history.

(56) References Cited

U.S. PATENT DOCUMENTS

| | | | |
|---|---|---|---|
| 6,556,487 B1* | 4/2003 | Ratnakumar | G11C 14/00 365/154 |
| 8,193,568 B2 | 6/2012 | Bhattacharyya | |
| 2006/0023503 A1* | 2/2006 | Lee | G11C 14/00 365/185.05 |
| 2007/0045706 A1 | 3/2007 | Bhattacharyya et al. | |
| 2009/0190402 A1* | 7/2009 | Hsu | G11C 14/0063 365/185.08 |

OTHER PUBLICATIONS

Tanaka et al., "Normally-off type nonvolatile static random access memory with perpendicular spin torque transfermagnetic random access memory cells and smallest number of transistors", Japanese Journal of Applied Physics, 53 04EM07, 2014, 5 pages.
Wang et al., "Achieving Versatile and Simultaneous Cache Optimizations With Nonvolatile SRAM", IEEE Transactons On Computer-Aided Design of Integrated Circuits and Systems, vol. 36, No. 2, Feb. 2017, 14 pages.

* cited by examiner

*Primary Examiner* — James G Norman
(74) *Attorney, Agent, or Firm* — David Cain; Andrew M. Calderon; Calderon Safran & Cole, P.C.

(57) ABSTRACT

The present disclosure relates to a structure including a latch circuit, a first non-volatile field effect transistor (FET) connecting to a first side of the latch circuit and a bit line, and a second non-volatile field effect transistor (FET) connecting to a second side of the latch circuit and a complementary bit line.

20 Claims, 8 Drawing Sheets

NON-VOLATILE TRANSISTOR EMBEDDED STATIC RANDOM ACCESS MEMORY (SRAM) CELL

FIELD OF THE INVENTION

The present disclosure relates to a non-volatile transistor embedded in a memory cell, and more particularly, to a circuit and method for a non-volatile transistor embedded in a static random access memory (SRAM) cell and methods of operation.

BACKGROUND

Memory devices are employed as internal storage areas in a computer or other electronic equipment. One specific type of memory used to store data in a computer is random access memory (RAM). RAM is typically used as the major on-chip as well as off-chip storage unit in a computing system, and is generally volatile in that once power is turned off, all data stored in the RAM is lost.

A static random access memory (SRAM) is one example of RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1").

Charge trap transistor (CTT) based storage arrays are typically standalone arrays which have a large overhead area. For example, applications need both the advantages of a high speed SRAM and CTT non-volatile storage separate arrays, which can incur a high separate peripheral cost.

SUMMARY

In an aspect of the disclosure, a structure includes a latch circuit, a first non-volatile field effect transistor (FET) connecting to a first side of the latch circuit and a bit line, and a second non-volatile field effect transistor (FET) connecting to a second side of the latch circuit and a complementary bit line.

In another aspect of the disclosure, a circuit includes a latch circuit which comprises a first PMOS transistor in series with a first NMOS transistor and a second PMOS transistor in series with a second NMOS transistor, a first non-volatile transistor connected to the first PMOS transistor in series with the first NMOS transistor, a second non-volatile transistor connected to the second PMOS transistor in series with the second NMOS transistor, and a wordline connected to the first non-volatile transistor and the second non-volatile transistor.

In another aspect of the disclosure, a method includes writing data in at least one non-volatile field effect transistor (FET) of a memory bitcell circuit by changing a threshold voltage of the at least one non-volatile FET, and reading the data in the at least one non-volatile FET of the memory bitcell circuit by using differential sensing of the at least one non-volatile FET.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a non-volatile transistor embedded in a memory cell, and more particularly, to a circuit for a non-volatile transistor embedded in a static random access memory (SRAM) cell and methods of operation. More specifically, the present disclosure includes a SRAM cell with charge trap transistor (CTT) devices. It should be understood by those of ordinary skill in the art that the non-volatile transistor can be used in any non-volatile transistor technology (i.e., ferroelectric field effect transistor (FET), magnetoelectric transistor, etc.) Advantageously, the non-volatile transistor described herein provides reduced area overhead and added capacity in a SRAM array (e.g., the SRAM array could be used as a look-up table or storage of network weights for a neural network), amongst other advantages described herein.

In known circuits, a SRAM cell has fast performance, but cannot store data when power is off; whereas, a charge trap transistor (CTT) has slow performance, but can store data when power is off. In known circuits, CTT circuits are standalone and require a larger area overhead due to a doubled periphery circuit and a dedicated CTT array. However, known circuits do not have a CTT circuit combined with the SRAM cell. Further, in the present disclosure, adding CTT into the SRAM cell helps to perform near memory computing between data stored in the CTT and the SRAM cell and improves memory density.

To overcome these and other issues and by way of a specific example, the present disclosure includes a structure which includes a memory circuit comprising a latch circuit connected to at least two non-volatile field effect transistors (FETs) configured to perform a read operation and/or a write operation. The present disclosure also includes a circuit comprising a latch circuit having a plurality of field effect transistors (FETs), and at least two charge trap transistors (CTTs) connected to the latch circuit and configured to perform a read operation and/or a write operation. The present disclosure also includes a method for writing data in at least one non-volatile field effect transistor (FET) of a memory bitcell circuit by changing a threshold voltage of the at least one non-volatile FET, and a method for reading the data in the at least one non-volatile FET of the memory bitcell circuit by using differential sensing of the at least one non-volatile FET.

Figure 1:
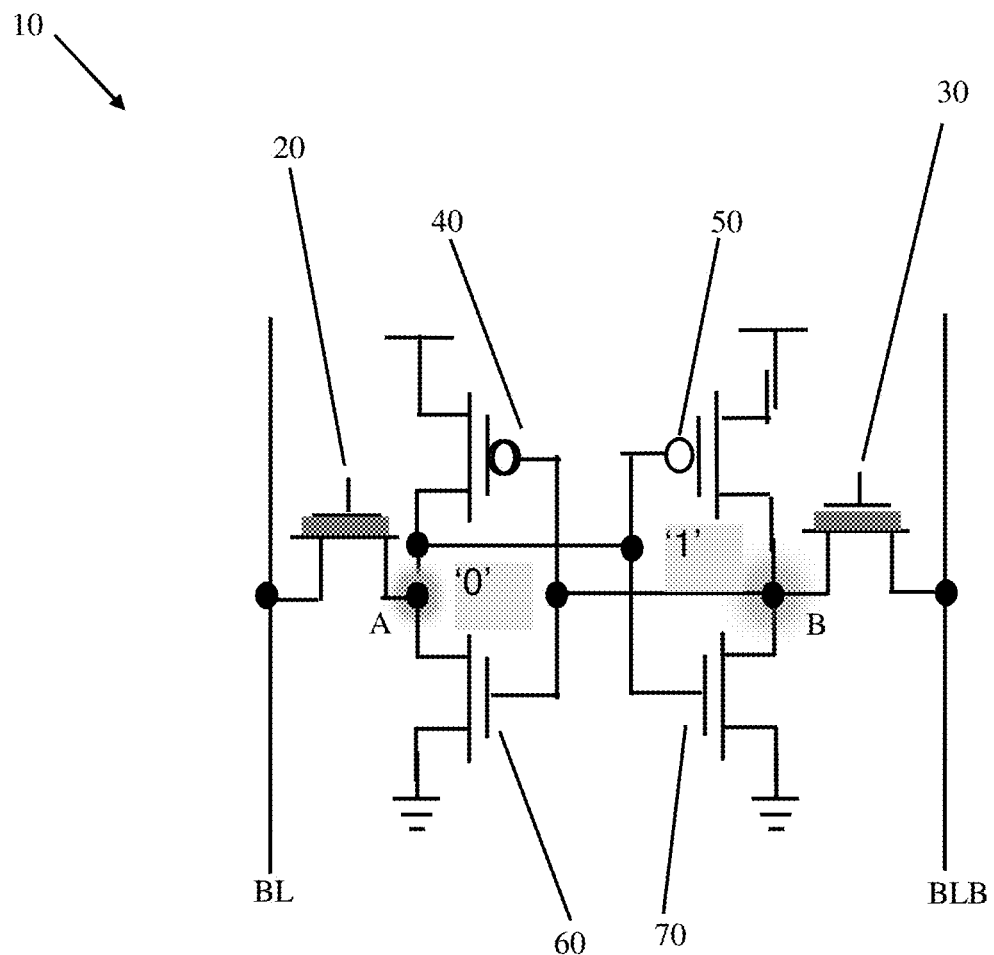
FIG. 1 shows a charge trap transistor (CTT) circuit embedded in a static random access memory (SRAM) cell in accordance with aspects of the present disclosure.

FIG. 1 shows a charge trap transistor (CTT) circuit embedded in a static random access memory (SRAM) cell in accordance with aspects of the present disclosure. In FIG. 1, CTT circuits 20, 30 are embedded in a SRAM cell 10. In this embodiment, the CTT circuits 20, 30 replace access transistors. The SRAM cell 10 includes a CTT circuit 20 which is connected to a bitline BL, a PMOS transistor 40, and a NMOS transistor 60. The SRAM cell 10 also includes a CTT circuit 30 which is connected to a complementary bitline BLB, a PMOS transistor 50, and a NMOS transistor 70. In the SRAM cell 10, the PMOS transistors 40, 50 and NMOS transistors 60, 70 form a latch circuit which is used to store bits. In particular, the SRAM cell 10 uses the CTT circuits 20, 30 to store either a '0' or '1' at storage nodes A and B using a write operation. Further, in a read operation, the storage nodes A and B are read using the CTT circuits 20, 30.

Figure 2:
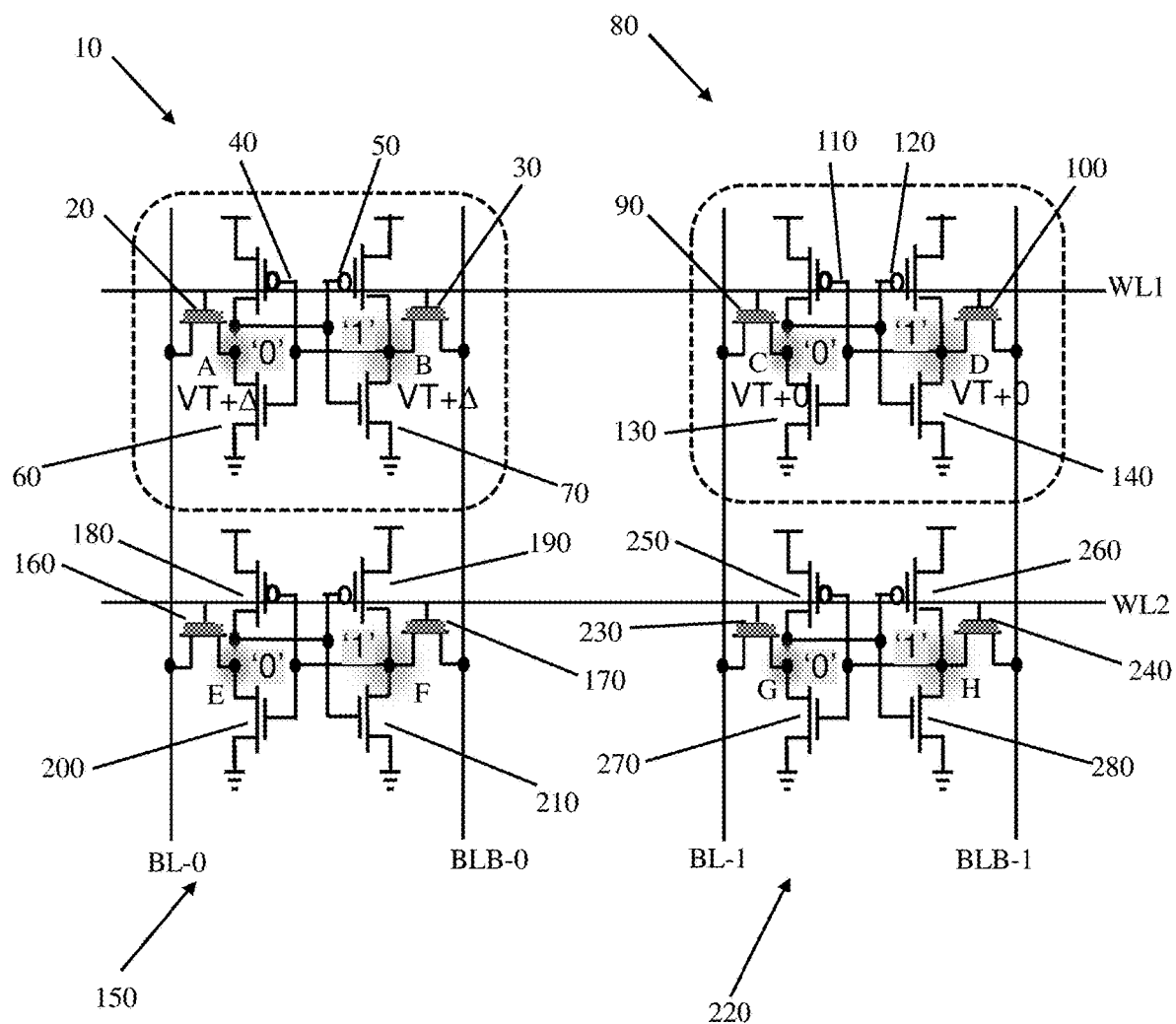
FIG. 2 shows a two bit data circuit per SRAM cell in accordance with aspects of the present disclosure.

FIG. 2 shows a two bit data circuit per SRAM cell in accordance with aspects of the present disclosure. More specifically, in FIG. 2 SRAM cells 10, 80, 150, and 220 are shown, each of which have similar structures. For example, similar to the structure of SRAM cell 10 shown in FIG. 1, the SRAM cell 80 has CTT circuits 90, 100, PMOS transistors 110, 120, and NMOS transistors 130, 140. The SRAM cells 10 and 80 have CTT circuits 20, 30, 90, and 100 which each have a gate connected to a wordline WL1. Similarly, the SRAM cell 150 has CTT circuits 160, 170, PMOS transistors 180, 190, and NMOS transistors 200, 210. The SRAM cell 220 has CTT circuits 230, 240, PMOS transistors 250, 260, and NMOS transistors 270, 280. The SRAM cells 150 and 220 have CTT circuits 160, 170, 230, and 240 which have a gate connected to a wordline WL2. In embodiments, the bitline BL-0 is connected to CTT circuits 20 and 160, bitline BLB-0 is connected to CTT circuits 30 and 170, bitline BL-1 is connected to CTT circuits 90 and 230, and bitline BLB-1 is connected to CTT circuits 100 and 240.

In the operation of SRAM cell 10 of FIG. 2, the threshold voltage (i.e., Vt) of CTT circuits 20 and 30 are raised symmetrically, as indicated by Vt+Δ. This allows the CTT data in the SRAM cell 10 to store a "1". In a non-limiting example of the present disclosure, the delta (i.e., Δ) could be approximately 250 millivolts. Further, in the operation of SRAM cell 80 of FIG. 2, the threshold voltage (i.e., Vt) of CTT circuits 90, 100 are not raised, as indicated by Vt+0. This causes the CTT data in the SRAM cell 20 to store a "0".

Figure 3A:
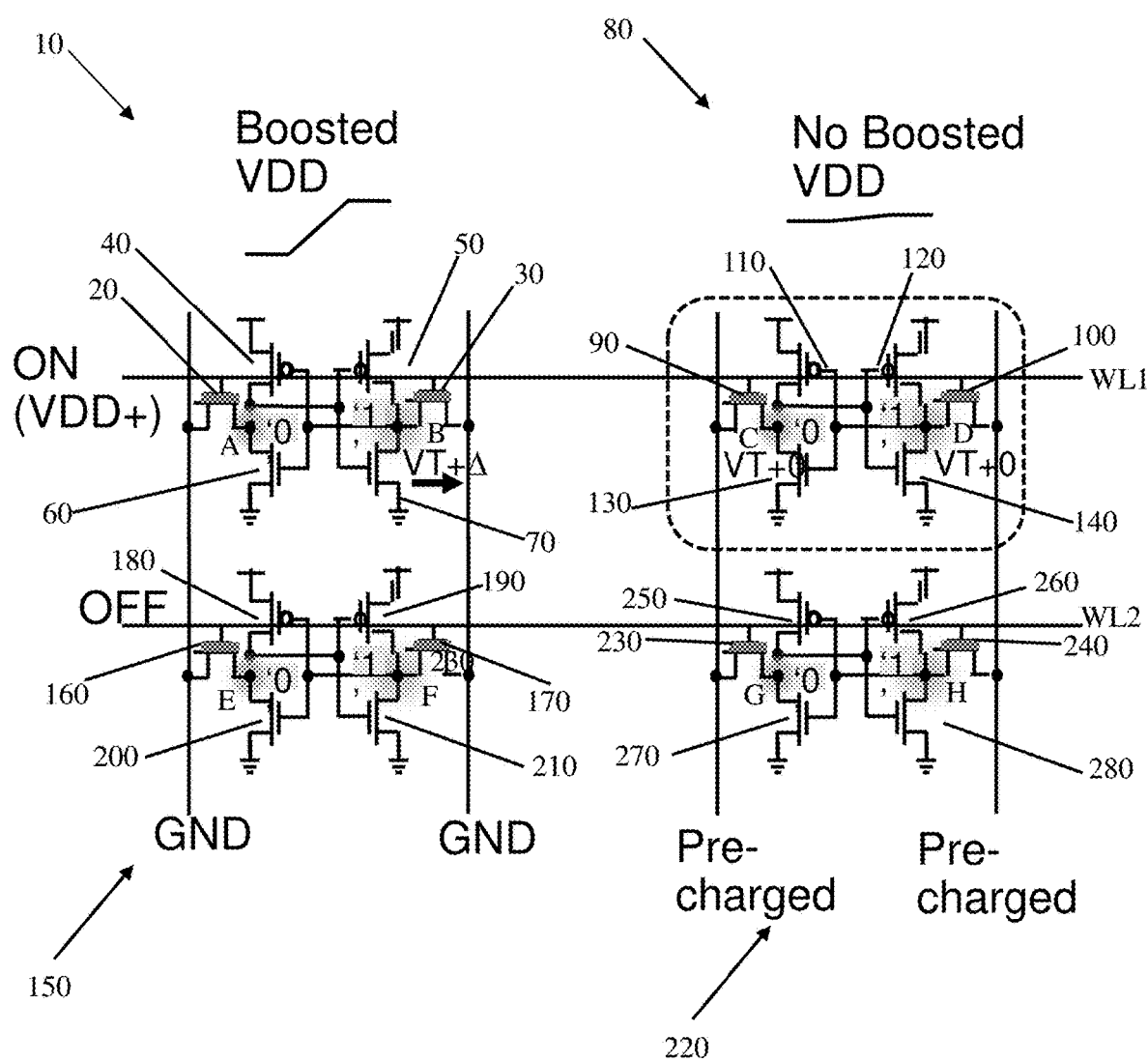
FIG. 3A shows a first step of a write operation into the CTT circuit of the two bit data circuit per SRAM in accordance with aspects of the present disclosure.

FIG. 3A shows a first step of a write operation into the CTT circuit of the two bit data circuit per SRAM in accordance with aspects of the present disclosure. FIG. 3A includes the SRAM cells 10, 80, 150, and 220 (similar to FIG. 2). In operation, the bitlines BL-0 and BLB-0 are set to ground (i.e., GND) and the bitlines BL-1 and BLB-1 are pre-charged. In the first step of the write operation of FIG. 3A, the wordline WL1 is turned ON at a voltage value greater than the voltage value of a power supply VDD (i.e., VDD+) and the wordline WL2 is turned OFF. Further, in the first step of the write operation of FIG. 3A, the SRAM cell 10 receives a boosted VDD and the threshold voltage (i.e., Vt) of the CTT circuit 30 is raised to a predetermined delta (e.g., 250 millivolts) to store a "1" in the CTT circuit 30. In the first step of the write operation of FIG. 3A, since the SRAM cell 80 does not have a boosted VDD, the threshold voltage (i.e., Vt) does not raise for the CTT circuit 100. Please note that to write CTT 30 the bitcell 10 is preprogrammed to 0 and 1 as shown in FIG. 3A.

Figure 3B:
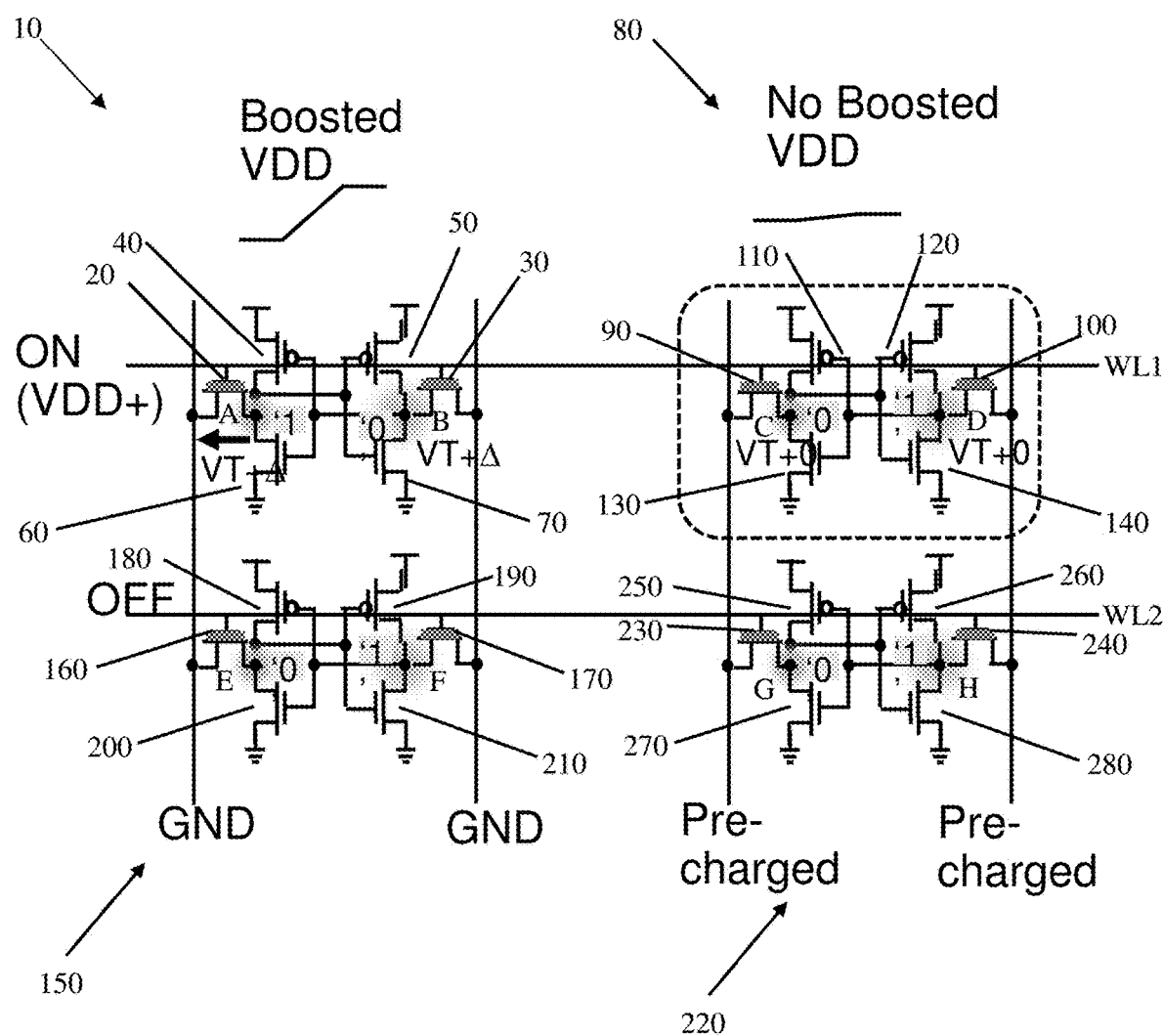
FIG. 3B shows a second step of a write operation into the CTT circuit of the two bit data circuit per SRAM in accordance with aspects of the present disclosure.

FIG. 3B shows a second step of a write operation into the CTT circuit of the two bit data circuit per SRAM in accordance with aspects of the present disclosure. In operation, the bitlines BL-0 and BLB-0 are set to ground (i.e., GND) and the bitlines BL-1 and BLB-1 are pre-charged. In the second step of the write operation of FIG. 3B, the wordline WL1 is turned ON at a voltage value greater than the voltage value of the power supply VDD (i.e., VDD+) and the wordline WL2 is turned OFF. Further, in the second step of the write operation of FIG. 3B, the SRAM cell 10 receives a boosted VDD and the threshold voltage (i.e., Vt) of the CTT circuit 20 is raised to a predetermined delta (e.g., 250 millivolts) to store a "1" in the CTT circuit 20. As the CTT circuit 30 already has its threshold voltage (i.e., Vt) raised from the first step of the write operation, the CTT circuit 30 stores a "0". In the second step of the write operation of FIG. 3A, since the SRAM cell 80 does not have a boosted VDD, the threshold voltage (i.e., Vt) does not raise for the CTT circuit 90. Please note that to write CTT 20 the bitcell 10 is preprogrammed to 1 and 0 as shown in the FIG. 3A.

Figure 4A:
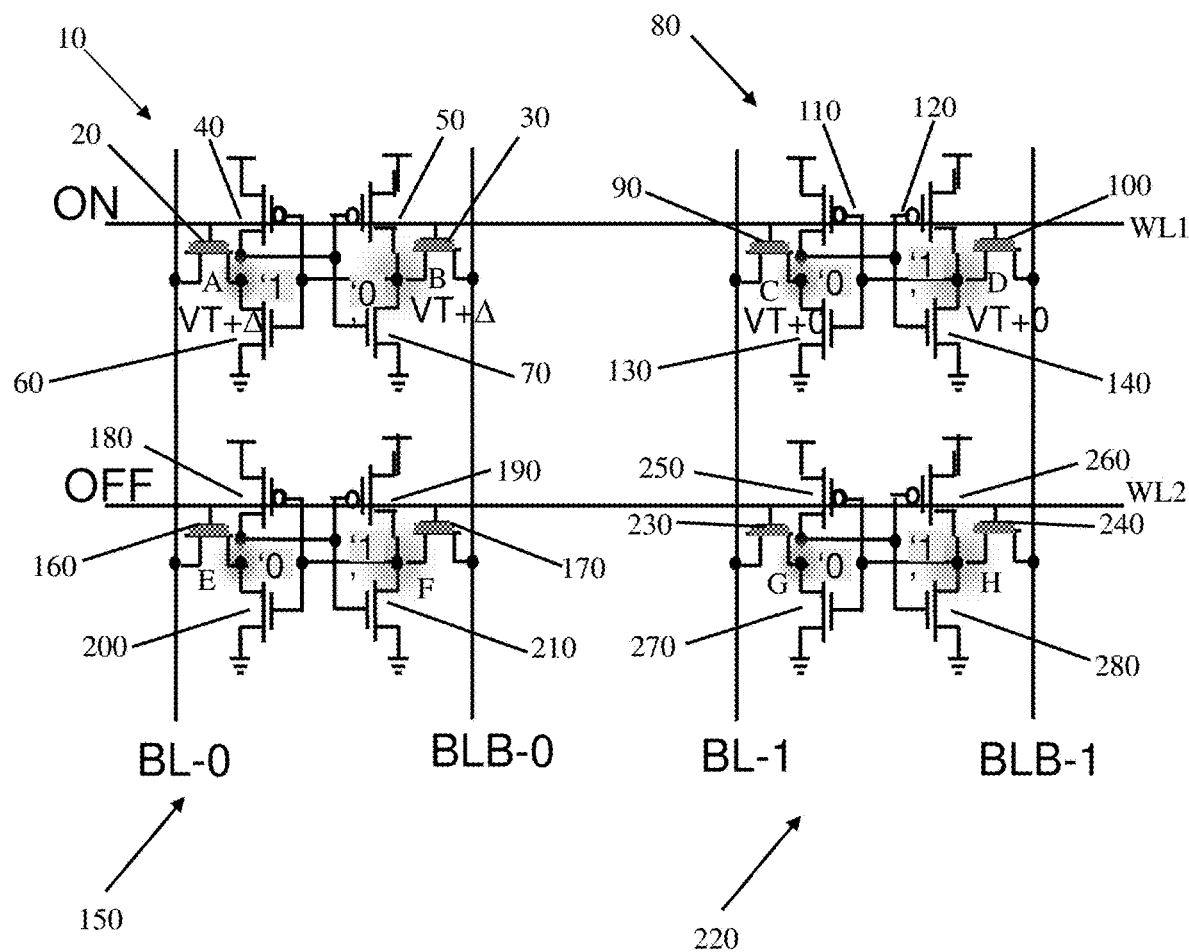
FIG. 4A shows a read operation from the CTT circuit of the two bit data circuit per SRAM in accordance with aspects of the present disclosure.

FIG. 4A shows a read operation from the CTT circuit of the two bit data circuit per SRAM in accordance with aspects of the present disclosure. FIG. 4A includes the SRAM cells 10, 80, 150, and 220 (similar to FIG. 2). The read operation of the CTT circuits 10, 80 use large signal sensing. In particular, the bitlines BL-0, BLB-0, BL-1, and BLB-1 are precharged for a read operation mode. For example, the bitline BL-0 is precharged high and the bitline BLB-0 is discharged through the storage node B. Also, the bitline BLB-1 is precharged high and the bitline BLB-1 is discharged through the storage node D. Then, the read operation occurs and will enable a sense amplifier of a corresponding SRAM cell (i.e., SRAM cell 10, 80, 150, or 220) to sense a difference between the bitline (e.g., BL-0 or BL-1) and the corresponding complementary bitline (e.g., BLB-0 or BLB-1). The CTT data of the CTT circuit (e.g., CTT circuit 10 or CTT 100) can then be read during the read operation.

Figure 4B:
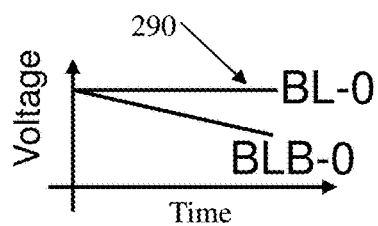
FIG. 4B shows a graph of the read operation from the CTT circuit of the two bit data circuit per SRAM in accordance with aspects of the present disclosure.
Figure 4B:
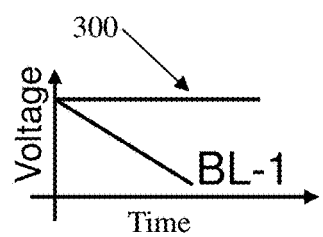

FIG. 4B shows a graph 290 of the bitlines BL-0 and BLB-1 as a function of voltage (y-axis) and time (x-axis). FIG. 4B also shows a graph 300 of the bitlines BL-1 and BLB-1 as a function of voltage (y-axis) and time (x-axis). In the graph 290, the bitline BL-0 is held at a constant voltage and the complementary bitline BLB-0 is discharged. In the graph 300, the bitline BLB-1 is held at a constant voltage and the complementary bitline BLB-1 is discharged. Further, reading the CTT data in FIG. 4A can be performed by looking at either the difference of the discharge rate between the complementary bitline BLB-0 and the complementary bitline BLB-1 or by the absolute discharge rate.

In FIG. 4B, when looking at the difference of the discharge rate between the complementary bitline BLB-0 and the complementary bitline BLB-1, a differential sense amplifier can be used to perform either a current sensing operation or single end sensing. When single ending sensing, an inverter can detect the slower discharge rate of the complementary bitline BLB-0 in graph 290, in comparison to the discharge rate of the complementary bitline BLB-1 in graph 300. Since the complementary bitline BLB-0 in graph 290 has a slower discharge rate in comparison to BLB-1 in graph 300, a "1" will be read from the CTT data of the CTT circuit 20. As the complementary bitline BLB-1 has a faster discharge rate in comparison to BLB-0, a "0" will be read from the CTT data of the CTT circuit 90.

Figure 5A:
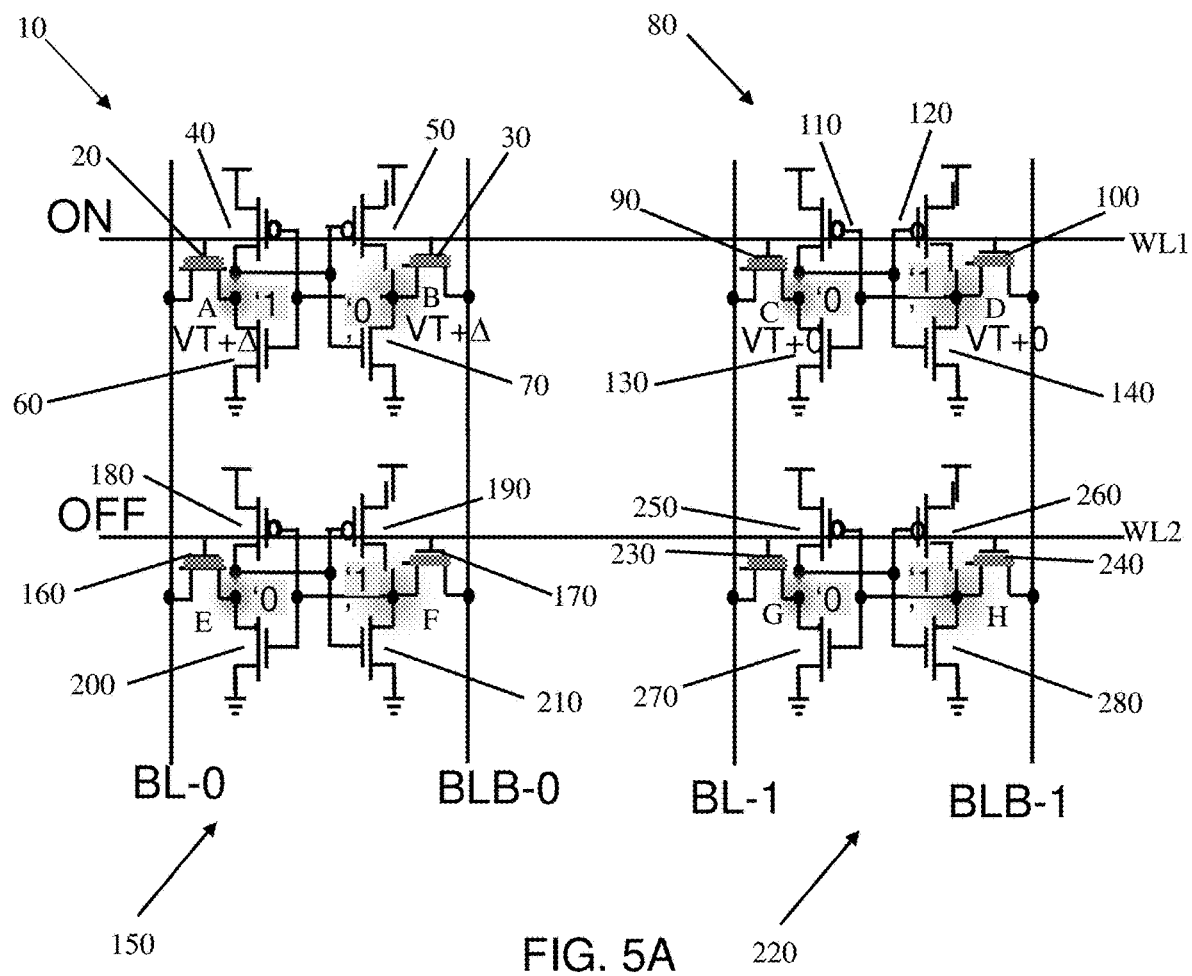
FIG. 5A shows a read operation from the SRAM cell in accordance with aspects of the present disclosure.

FIG. 5A shows a read operation from the SRAM cell in accordance with aspects of the present disclosure. FIG. 5A includes the SRAM cells 10, 80, 150, and 220 (similar to FIG. 2). The read operation in FIG. 5A uses a SRAM based differential sensing with delayed sense amplifier trigger that can sense the SRAM data.

In FIG. 5A, the wordline WL1 is turned ON and the wordline WL2 is turned OFF. The bitlines BL-0, BLB-0, BL-1, and BLB-1 are precharged for a read operation mode. For example, the bitline BL-0 is precharged high and the bitline BLB-0 is discharged through the storage node B. Also, the bitline BLB-1 is precharged high and the bitline BLB-1 is discharged through the storage node D. In embodiments, the delay overhead should be minimal, e.g., less than 1 nanosecond.

Figure 5B:
FIG. 5B shows a graph of the read operation from the SRAM cell in accordance with aspects of the present disclosure.

FIG. 5B shows a graph 310 of the bitlines BL-0 and BLB-1 as a function of voltage (y-axis) and time (x-axis). FIG. 5B also shows a graph 320 of the bitlines BL-1 and BLB-1 as a function of voltage (y-axis) and time (x-axis). In FIG. 5B, when looking at the difference of the discharge rate between the complementary bitline BLB-0 and the complementary bitline BLB-1, a SRAM based differential sensing can detect the slower discharge rate of the complementary bitline BLB-0 in graph 310 in comparison to the discharge rate of the complementary bitline BLB-1 in graph 320. Since the complementary bitline BLB-0 in graph 310 has a slower discharge rate in comparison to BLB-1 in graph 320, a "1" will be read from the SRAM data of the SRAM cell 10. As the complementary bitline BLB-1 has a faster discharge rate in comparison to BLB-0, a "0" will be read from the SRAM data of the SRAM cell 80. In the present disclosure, the read operation of an SRAM bit is a typical read operation, wherein both BL's and BLB's are precharged to Vdd. Based on the data stored in the storage nodes of the bitcell, either BL or BLB will discharge, while the other will remain at Vdd. The difference between BL and BLB can then be sensed using a differential sense amplifier. The sense amplifier activation time for sensing will be determined by the bitcell with CTT elements storing a "1" causing slow discharge rate. Further, a predetermined voltage split (e.g. 100 mV) will be used to design the sense amplifier activation control circuit.

Figure 6:
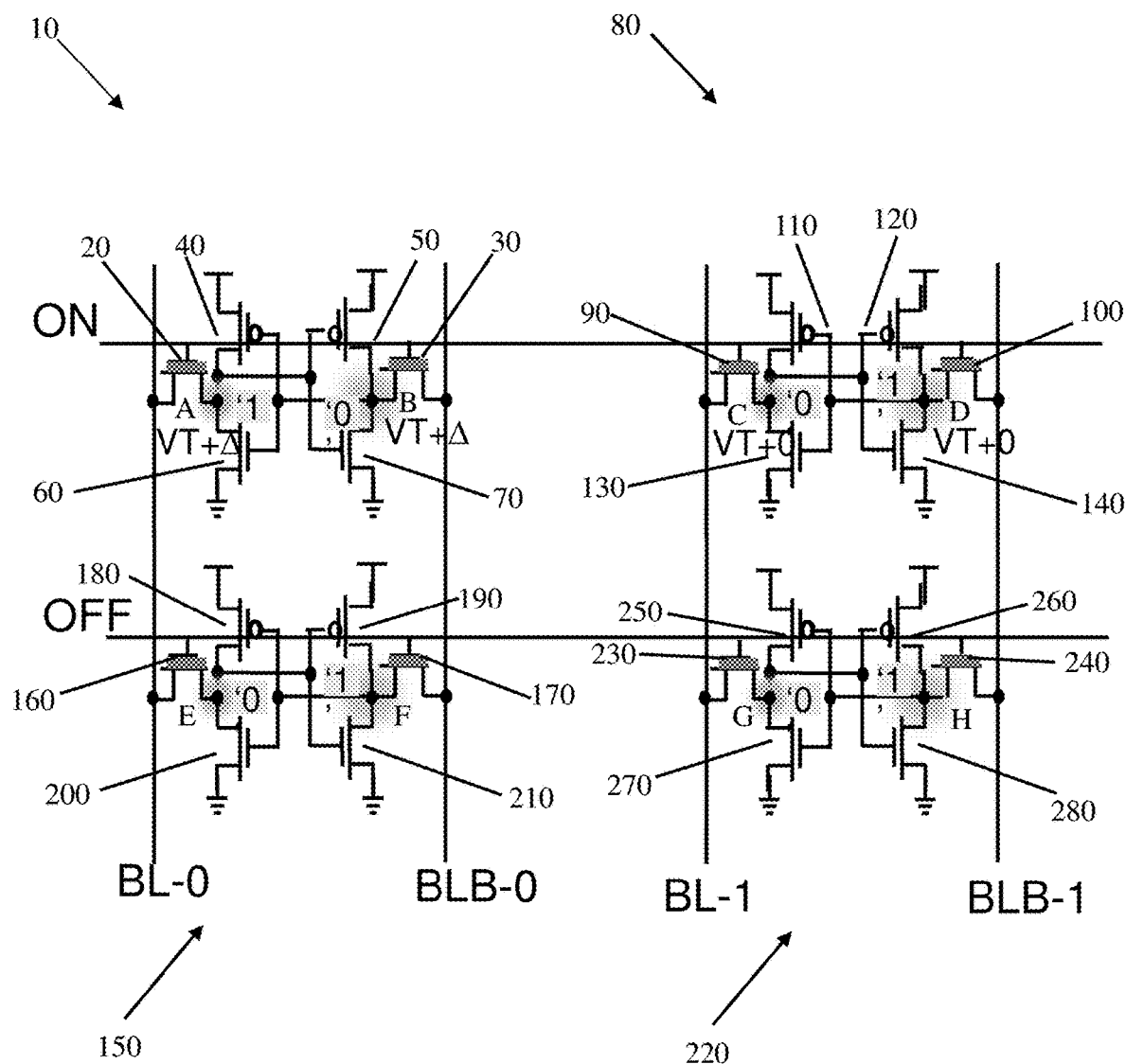
FIG. 6 shows a write operation into the SRAM cell in accordance with aspects of the present disclosure.

FIG. 6 shows a write operation into the SRAM cell in accordance with aspects of the present disclosure. FIG. 6 includes the SRAM cells 10, 80, 150, and 220 (similar to FIG. 2). In the write operation into the SRAM cells of FIG. 6, the wordline WL1 is turned ON and the wordline WL2 is turned OFF. Further, in the write operation of FIG. 6, each of the SRAM cells 10, 80, 150, and 220 can be written into even with threshold voltage plus delta (Vt+Δ) access transistors using known wordline boosting write assisting techniques.

Figure 7:
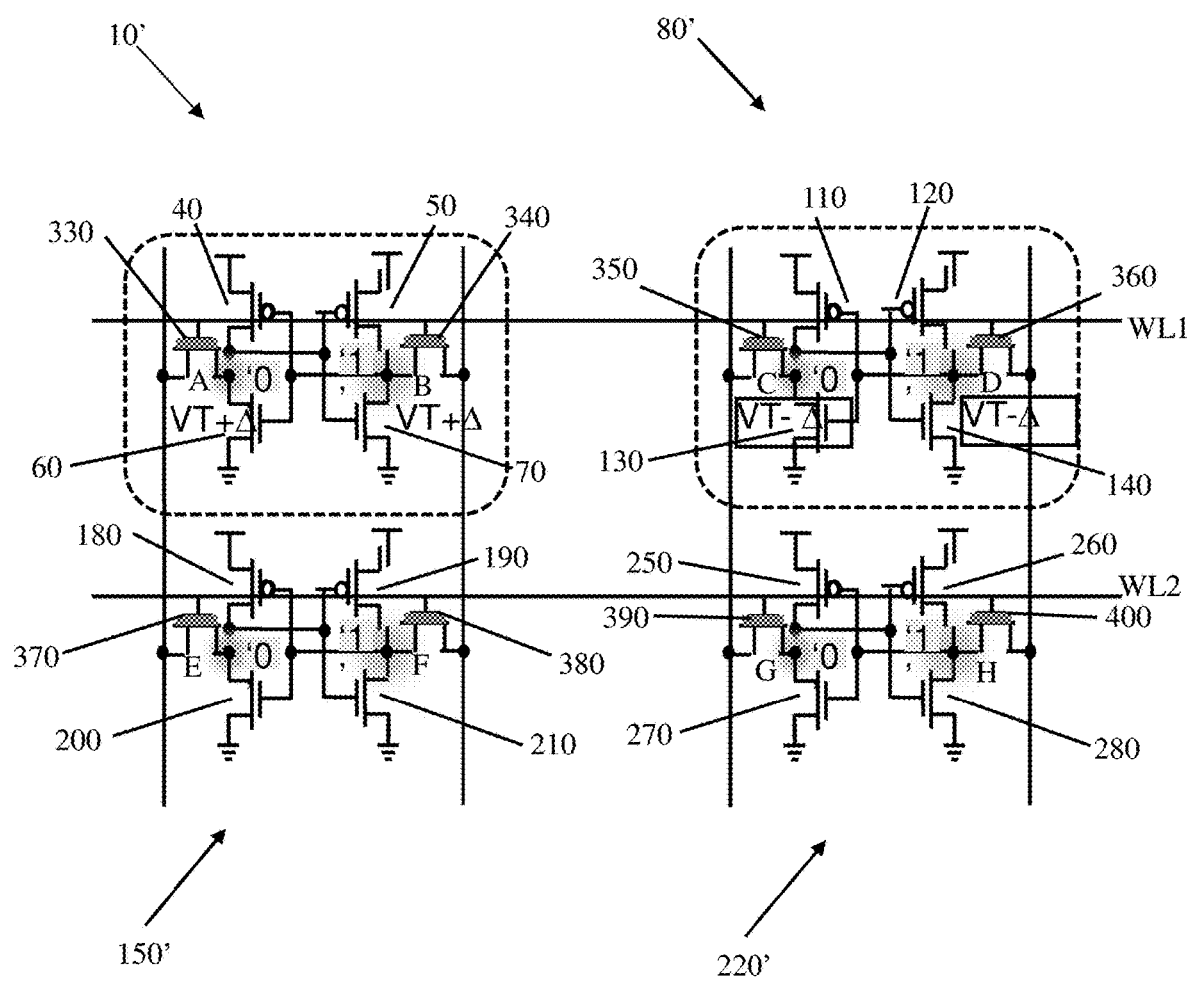
FIG. 7 shows a non-volatile memory circuit embedded in a SRAM cell in accordance with another aspect of the present disclosure.

FIG. 7 shows a non-volatile memory (NVM) circuit embedded in a static random access memory (SRAM) cell in accordance with additional aspects of the present disclosure. In embodiments, FIG. 7 has SRAM cells 10', 80', 150', and 220', which are similar to the SRAM cells shown in FIG. 2, with the exception that the CTT devices are replaced by other non-volatile memory (NVM) devices (e.g., ferroelectric field effect transistors, magnetoelectric transistors, etc.). More specifically, the SRAM cells 10', 80', 150' and 220' in FIG. 7 are similar to the SRAM cells 10 80, 150 and 220 of FIG. 2, except that the each of the CTT devices are replaced by respective non-volatile memory (NVM) devices, i.e., NVM device 330, 340 for SRAM cell 10', NVM devices 350, 360 for SRAM cell 80', NVM devices 370, 380 for SRAM cell 150', and NVM devices 390, 400 for SRAM cell 220'.

In the operation of SRAM cell 10' of FIG. 7, the threshold voltage (i.e., Vt) of the other NVM devices 330, 340 are raised symmetrically, as indicated by Vt+Δ. This allows the CTT data in the SRAM cell 10' to store a "1". In a non-limiting example of the present disclosure, the delta (i.e., Δ) could be approximately 250 millivolts. Further, in the operation of SRAM cell 80' of FIG. 7, the threshold voltage (i.e., Vt) of the other NVM devices 350, 360 are reduced symmetrically, as indicated by Vt−Δ. This causes the CTT data in the SRAM cell 20 to store a "0".

Further, the threshold voltage (i.e., Vt) of the other NVM devices 350, 360 are reduced by changing the polarization by passing the current in the other direction. In other words, the current is passed from the other NVM devices 350, 360 towards the corresponding SRAM storage nodes C, D. This reduced threshold voltage (i.e., Vt) will accentuate the differential between the threshold voltages of the other NVM devices 330, 340 (i.e., Vt+Δ) and the threshold voltages of the other NVM devices 350, 360 (i.e., Vt−Δ) to perform read and write operations as described above. In the alternate embodiment of FIG. 7, ferroelectric field effect transistors, magnetoelectric transistors, and other NVM devices 330, 340, 350, 360, 370, 380, and 390 are used to reduce the voltage threshold (i.e., Vt−Δ), because the CTT circuits 20, 30, 90, 100, 160, 170, 230, and 240 of FIG. 2 cannot change the direction of current and reduce the voltage threshold (i.e., Vt−Δ).

The circuit and method for a non-volatile transistor embedded in a static random access memory (SRAM) cell of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a non-volatile transistor embedded in a static random access memory (SRAM) cell of the present disclosure has been adopted from integrated circuit (IC) technology. For example, the structures are built on wafers and are realized in films of material patterned by photolithographic processes on the top of a wafer. In particular, the fabrication of the a circuit and method for a non-volatile transistor embedded in a static random access memory (SRAM) cell uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a latch circuit;
   a first non-volatile field effect transistor (FET) connecting to a first side of the latch circuit and a bit line;
   a second non-volatile field effect transistor (FET) connecting to a second side of the latch circuit and a complementary bit line; and
   a wordline is directly connected to a gate of the first non-volatile FET and directly connected to a gate of the second non-volatile FET,
   wherein the first non-volatile field effect transistor (FET) is between and directly connected to the latch circuit and directly connected to the bit line.

2. The structure of claim 1, wherein the second non-volatile field effect transistor is between and directly connected to the latch circuit and directly connected to the complementary bit line.

3. The structure of claim 1, further comprising a first storage node between and directly connected to the first non-volatile field effect transistor and directly connected to the latch circuit and a second storage node between and directly connected to the second non-volatile field effect transistor and directly connected to the latch circuit.

4. The structure of claim 1, wherein the latch circuit comprises a first PMOS transistor directly connected to a second PMOS transistor, and a first NMOS transistor directly connected to a second NMOS transistor.

5. The structure of claim 4, wherein a gate of the first PMOS transistor and a gate of the first NMOS transistor is connected to a first storage node and a gate of the second PMOS transistor and a gate of the second NMOS transistor is connected to a second storage node.

6. The structure of claim 1, wherein the first non-volatile field effect transistor and the second non-volatile field effect transistor comprise a charge trap transistor (CTT).

7. The structure of claim 1, wherein the first non-volatile field effect transistor and the second non-volatile field effect transistor comprise a ferroelectric field effect transistor (FET).

8. The structure of claim 1, wherein the first non-volatile field effect transistor and the second non-volatile field effect transistor comprise a magnetoelectric transistor.

9. The structure of claim 1, wherein the latch circuit and the first and second non-volatile field effect transistor (FET) comprise a static random access memory (SRAM).

10. The structure of claim 9, wherein the SRAM is configured to perform a write operation which changes a threshold voltage (Vt) of the first non-volatile field effect transistor and the second non-volatile field effect transistor to write data to the SRAM.

11. The structure of claim 10, wherein the write operation uses boosting of the wordline directly connected to the gate of the first non-volatile field effect transistor and the gate of the second non-volatile field effect transistor to write the data to the SRAM.

12. The structure of claim 9, wherein the SRAM is configured to perform a read operation which uses differential sensing of the first non-volatile field effect transistor and the second non-volatile field effect transistor to read the data from the SRAM.

13. The structure of claim 12, wherein the read operation uses the differential sensing of the first non-volatile field effect transistor and the second non-volatile field effect transistor with a delayed sense amplifier trigger to read the data from the SRAM.

14. A circuit, comprising:
    a latch circuit which comprises a first PMOS transistor in series with a first NMOS transistor and a second PMOS transistor in series with a second NMOS transistor;
    a first non-volatile transistor connected to the first PMOS transistor in series with the first NMOS transistor;
    a second non-volatile transistor connected to the second PMOS transistor in series with the second NMOS transistor; and
    a wordline is directly connected to a gate of the first non-volatile transistor and directly connected to a gate of the second non-volatile transistor,
    wherein the first non-volatile transistor is between and directly connected to the latch circuit and directly connected to a bit line.

15. The circuit of claim 14, wherein the first non-volatile transistor and the second non-volatile transistor comprise charge trap transistors (CTTs).

16. The circuit of claim 15, further comprising a first storage node between and directly connected to the first non-volatile field effect transistor and directly connected to the latch circuit.

17. The circuit of claim 15, further comprising a second storage node between and directly connected to the second non-volatile field effect transistor and directly connected to the latch circuit.

18. The circuit of claim 15, wherein the charge trap transistors (CTTs) are configured to perform a read operation which uses a differential sensing of the charge trap transistors (CTTs) to read data from the circuit and perform a write operation to write the data to the circuit by changing a threshold voltage (Vt) of the charge trap transistors (CTTs).

19. The circuit of claim 18, wherein each of the charge trap transistors (CTTs) have the gate connected to the wordline.

20. A method, comprising:
    writing data in at least one non-volatile field effect transistor (FET) of a memory bitcell circuit by changing a threshold voltage of the at least one non-volatile FET; and
    reading the data in the at least one non-volatile FET of the memory bitcell circuit by using differential sensing of the at least one non-volatile FET,
    wherein a wordline is directly connected to a gate of a first non-volatile FET of the at least one non-volatile FET and directly connected to a gate of a second non-volatile FET of the at least one non-volatile FET,
    wherein the first non-volatile FET of the at least one non-volatile field effect transistor (FET) is between and directly connected to a latch circuit and directly connected to a bit line.

* * * * *